(12) United States Patent
Zhang et al.

(10) Patent No.: US 8,669,650 B2
(45) Date of Patent: Mar. 11, 2014

(54) FLIP CHIP SEMICONDUCTOR DEVICE

(75) Inventors: Xiaotian Zhang, San Jose, CA (US); Hamza Yilmaz, Saratoga, CA (US); Jun Lu, San Jose, CA (US); Xiaoguang Zeng, Songjiang (SG); Ming-Chen Lu, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 363 days.

(21) Appl. No.: 13/244,256

(22) Filed: Sep. 23, 2011

(65) Prior Publication Data

US 2012/0248539 A1    Oct. 4, 2012

Related U.S. Application Data

(63) Continuation-in-part of application No. 13/077,720, filed on Mar. 31, 2011, and a continuation-in-part of application No. 13/092,059, filed on Apr. 21, 2011, now Pat. No. 8,481,368.

(51) Int. Cl.
*H01L 23/495* (2006.01)
*H01L 23/02* (2006.01)

(52) U.S. Cl.
USPC .............. 257/676; 257/666; 257/686

(58) Field of Classification Search
USPC ......... 257/666, 672, 675, 676, 685, 686, 692, 257/693, 698, 723, 724, 734, 777, E23.042, 257/E23.043, E23.046, E23.052, E23.061
See application file for complete search history.

(56) References Cited

U.S. PATENT DOCUMENTS

| | | | |
|---|---|---|---|
| 7,262,491 B2* | 8/2007 | Islam et al. | 257/670 |
| 7,271,477 B2* | 9/2007 | Saito et al. | 257/686 |
| 2006/0180904 A1* | 8/2006 | Ong | 257/676 |

* cited by examiner

*Primary Examiner* — Hung Vu
(74) *Attorney, Agent, or Firm* — Chein-Hwa Tsao; CH Emily LLC

(57) ABSTRACT

A semiconductor device package comprises a lead frame having a die paddle comprising a first chip installation area and a second chip installation area, a recess area formed in the first chip installation area, and multiple metal pillars formed in the recess area, a notch divides the first chip installation area into a transverse base extending transversely and a longitudinal base extending longitudinally, and separates the recess area into a transverse recess part formed in the transverse base and a longitudinal recess part formed in longitudinal base; a portion of a transverse extending part connecting to an external pin extends into a portion inside of the notch.

27 Claims, 9 Drawing Sheets

FLIP CHIP SEMICONDUCTOR DEVICE

PRIORITY CLAIM

This application is a continuation-in-part (CIP) and claims the benefit of priority of commonly assigned U.S. patent application Ser. No. 13/077,720 filed Mar. 31, 2011 and U.S. patent application Ser. No. 13/092,059 filed Apr. 21, 2011 now U.S. Pat. No. 8,481,368, the entire disclosures of which are incorporated herein by reference.

FIELD OF THE INVENTION

This invention generally relates to a power semiconductor device and its preparation method, more specifically, to a semiconductor device integrated with multiple MOSFETs and a power control IC.

BACKGROUND OF THE INVENTION

To achieve the objectives of energy saving, high efficiency and small form factor, electronic device requires power supply with higher efficiency. Meanwhile, telecom equipment and servers with higher speed and more storage capacity consume more electricity. As a result, some devices such as DC/DC conversion power supply in these equipments need energy saving design and require lower output voltage and lower power consumption in idle mode. Therefore, power MOSFET with high efficiency, tiny and thin package, low voltage, large current, high conversion rate and intelligent control is developed.

In traditional power semiconductor device, if multiple semiconductor chips are included in an integrated package, then the lead frame may includes multiple separate die paddles for different chips. As shown in FIG. 1, semiconductor device 100 includes multiple MOSFETs 110, 111 and a power control IC 112 respectively connecting to separate die paddles 101 and 102, thus resulting into a big footprint for the device 100. Furthermore, due to separate die paddles 101 and 102, thermal dissipation effect for MOSFETs 110, 111 is not optimized.

FIG. 2 is a cross sectional diagram of a flip chip configuration of a conventional semiconductor device. In semiconductor device 200, a semiconductor chip 210 is stacked on multiple pins 201 through multiple solder bumps 220. In this configuration, the lead frame only consists of multiple pins 201. However, one disadvantage of this configuration is that the semiconductor chip 210 is not exposed out of the plastic package for heat dissipation, therefore this configuration cannot be applied for MOSFETs that require large thermal dissipation capability.

FIG. 3 shows a top view of another flip chip configuration of a conventional semiconductor device. In semiconductor device 300, an electrode (such as gate electrode) of flip chip 310 is connected to a metal bump 302a of a lead 302, while another electrode (such as source electrode) is connected to metal bump 301a on a die paddle 301, as such the plastic packaging materials cannot be completely filled in the notch between chip 310 and die paddle 301. With the current requirement in reducing working voltage of electronic products, power device usually requires DC-DC converter with low voltage, large output current as well as high thermal dissipation capability and high reliability, the improvement in thermal dissipation or reliability of the power semiconductor devices is necessary.

BRIEF DESCRIPTION OF THE DRAWINGS

Refer to the attached figures to further describe the embodiments of this invention. While, the attached figures are used for illustration and explanation only, and don't form a limit on the scope of this invention.

DETAILED DESCRIPTION OF THE EMBODIMENTS

Figure 1:
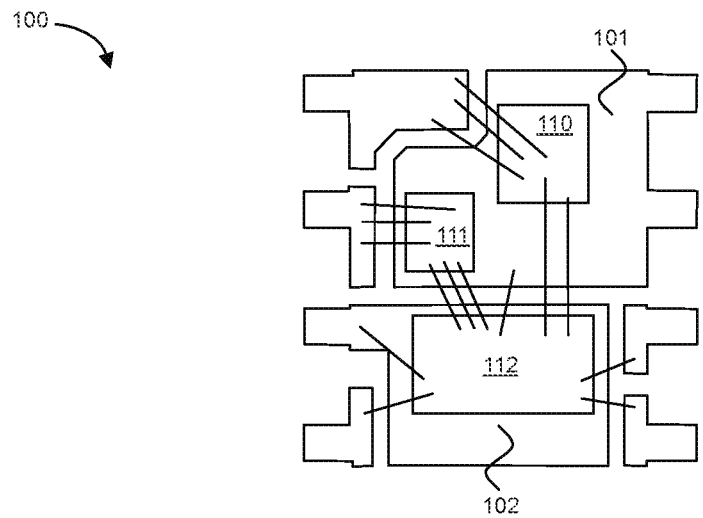
FIG. 1 is a top view illustrating a conventional power semiconductor device with multiple semiconductor chips.
Figure 2:
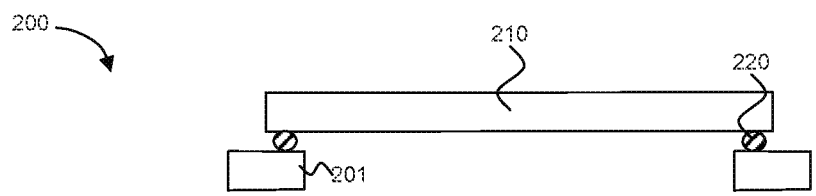
FIG. 2 is for a cross sectional view illustrating a flip chip stacked on multiple pins through soldering bumps of the prior art.
Figure 3:
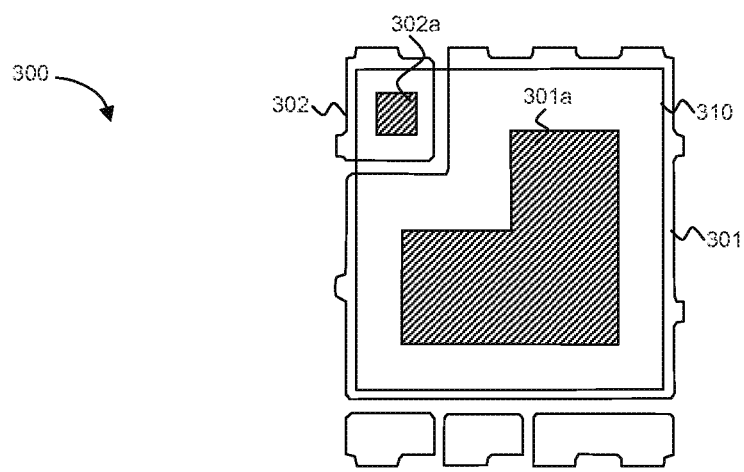
FIG. 3 is top view illustrating a flip chip stacked on separate die paddle and lead of the prior art.
Figure 4A:
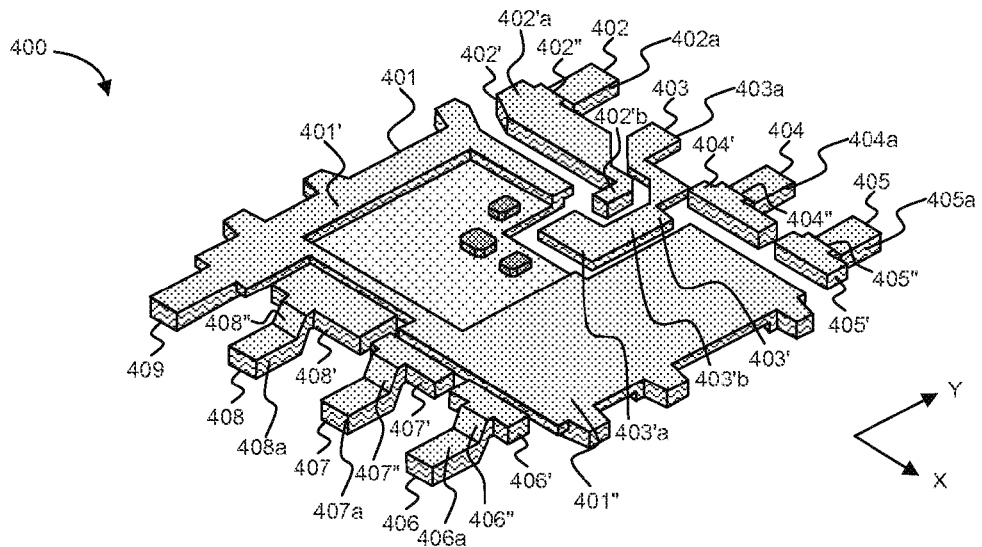
FIG. 4A is a perspective view illustrating a lead frame in this invention.

FIG. 4A is a perspective view illustrating a lead frame unit 400 of this invention. As shown in FIG. 4A and FIG. 4C, a die paddle 401 of the lead frame unit 400 includes a first chip installation area 401' and a second chip installation area 401" adjacent to each other, and a notch 401'b that can be formed in the first chip installation area 401'. A recess area 401'a is formed in the first chip installation area 401'. Notch 401'b divides the first chip installation area 401' into a transverse base 401'-2 parallel to the X axis and a longitudinal base 401'-1 parallel to the Y axis, with the bases 401'-1 and 401'-2 of the first chip installation area 401' roughly forming an "L" shape. Notch 401'b is therefore surrounded by the longitudinal base 401'-1, the transverse base 401'-2 and the second chip installation area 401". Along the X direction, notch 401'b extends to the recess area 401'a, thus dividing the recess area 401'a into a transverse recess part 401'a-2 formed in transverse base 401'-2 and extending transversely and a longitudinal recess part 401'a-1 formed in longitudinal base 401'-1 and extending longitudinally, as a result, the recess area 401'a consisting of transverse recess part 401'a-2 and longitudinal recess part 401'a-1 also forms an "L" shape. Multiple metal pillars 401'c are also formed in recess area 401'a.

Figure 4B:
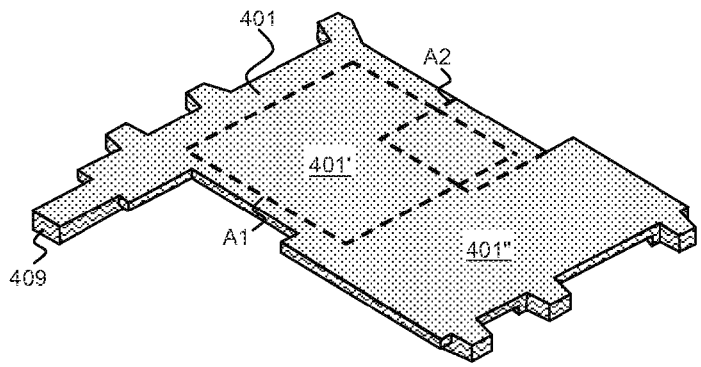
FIGS. 4B and 4C are perspective views illustrating a die paddle of the lead frame in FIG. 4A before and after forming a notch and a recess area.
Figure 4C:
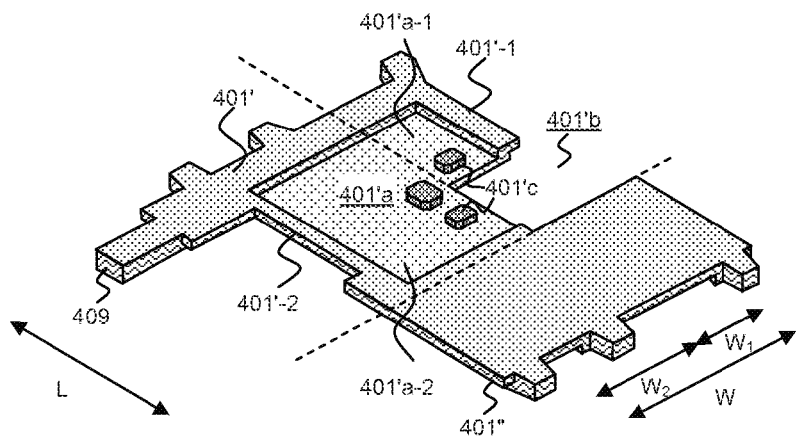

To further understand the structure of the die paddle 401, FIG. 4B displays the initial structure of base 401. In the initial first chip installation area 401', the area framed by dotted line A1 is used to form the recess area, for example when semi-etching method is applied. The recess area can be cuboids, cube, or other suitable shapes. In addition, in the initial first chip installation area 401', the area framed by dotted line A2 is used to form a notch. As described above, the initial first chip installation area 401' is divided by the notch formed in the area framed by dotted line A2 into transverse base 401'-2 and longitudinal base 401'-1, as a result the first chip installation area 401' is roughly of a three-dimensional L shape structure. The transverse base 401'-2 is directly connected to the second chip installation area 401". In addition, since the area framed by dotted line A1 and the area framed by A2 are overlapped to some extent, the prefabricated recess area is divided by the notch into transverse recess part 401'a-1 and longitudinal recess part 401'a-2, and the recess area 401'a is arranged along the edge of the interface between notch 401'b and the longitudinal base 401'-1 and along the edge of the interface between notch 401'b and the transverse base 401'-2. Moreover, the recess area 401'a is roughly a three-dimensional L shape structure. In addition, if a metal pillar 401'c is formed in the recess area, the top surface of the metal pillar is at the same plane with the top surface of the second chip installation area 401".

The lead frame unit 400 also includes a first pin 402, a second pin 403 and a third pin 408 adjacent to and separate from the first chip installation area 401'. The first pin 402 includes a first external pin 402a and a first pin soldering area 402' connected to the first external pin 402a. The first external pin 402a is connected to the first pin soldering area 402' through a first connecting part 402" that bends upward, as such the position of the first pin soldering area 402' is higher than that of the first external pin 402a, while the first external pin 402a is roughly at the same level with the die paddle 401. Moreover, the first pin soldering area 402' includes the first transversely extending part 402'a parallel to the X direction and the first longitudinally extending part 402'b parallel to the Y direction connecting and perpendicular to the first transversely extending part 402'a, and the first transversely extending part 402'a is adjacent to the longitudinal base 401'-1 and extending along the transverse edge of longitudinal base 401'-1.

The second pin 403 includes the second external pin 403a and the second pin soldering area 403' that connects to the second external pin 403a. The second pin soldering area 403' includes the second transverse extending part 403'a and the second longitudinal extending part 403'b connecting and perpendicular to the second transverse extending part 403'a. The second longitudinal extending part 403'b and the second transverse extending part 403'a extend into the notch 401'b with the second longitudinal extending part 403'b extending along, but separate from, the edge of the second chip installation area 401". In addition, the first transverse extending part 402'a is adjacent to the longitudinal base 401'-1 and extends transversely until the first longitudinal extending part 402'b is proximity to the second longitudinal extending part 403'b. The first longitudinal extending part 402'b is adjacent and parallel to the second longitudinal extending part 403'b. The third pin 408 includes a third external pin 408a and a third pin soldering area 408' that connects to the third external pin 408a through a third connecting part 408" that bends upward, so that the position of the third pin soldering area 408' is higher than that of the third external pin 408a. The third pin soldering area 408' is adjacent to transverse base 401'-2, and the third external pin 408a is roughly at the same level with the die paddle 401.

The lead frame unit 400 also includes a fourth pin 409 that connects to transverse base 401'-2 and directly connects to the first chip installation area 401' and is roughly at the same level with die paddle 401. In addition, the lead frame unit 400 also includes multiple fifth pins adjacent to the second chip installation area 401", which are arranged at the both sides of the second chip installation area 401", such as the fifth pin 404, 405, 406, 407 shown in FIG. 4A. Each fifth pin includes a fifth external pin and the fifth pin soldering area connecting to the fifth external pin, and the position of the fifth pin soldering area is higher than that of the corresponding fifth external pin, for example, the fifth pin 404 (or 405, 406, 407) includes the fifth external pin 404a (or corresponding 405a, 406a, 407a) and the fifth pin soldering area 404' (or 405', 406', 407') that connects to the fifth external pin 404 (or 405, 406, 407 through the fifth connecting part 404" (or 405", 406", 407") that bends upward, so that the fifth pin soldering area 404' (or 405', 406', 407') must be higher than the fifth external pin 404a (or 405a, 406a, 407a). In the lead frame unit 400, the fourth pin 409, the third pin 408, the fifth pins 406, 407 are at one side of the die paddle 401, and the first pin 402, the second pin 403, the fifth pins 404, 405 are at the other side of the die paddle 401. The fourth pin 409, the third external pin 408a, the fifth external pins 407a and 406a are roughly at the same level and along the same line with each other, while the first external pin 402a, the fifth external pins 404a and 405a are roughly at the same level and along the same line with each other. The second external pin 403a can be a hidden pin, thus it is shorter and not in the same line with the first external pin 402a, the fifth external pins 404a and 405a. Moreover, the second pin 403 is thinner than that of the die paddle 401, such that the top of the second transverse extending part 403'a can be at the same level with the top of the metal pillar 401'c. Optionally, the second external pin 403a can also extends outward and is aligned with the first external pin 402a, the fifth external pins 404a and 405a.

Figure 5:
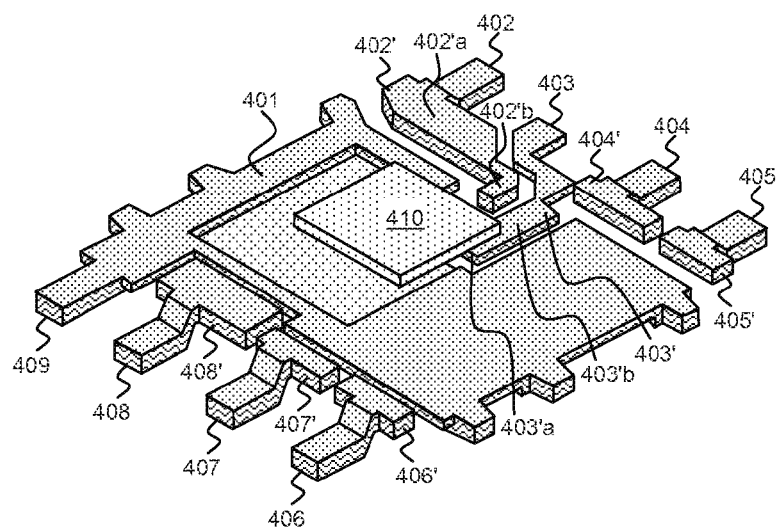
FIG. 5 is diagram perspective view illustrating a first semiconductor chip flipped and attached on the first chip installation area of the die paddle of the lead frame of FIG. 4A.
Figure 6:
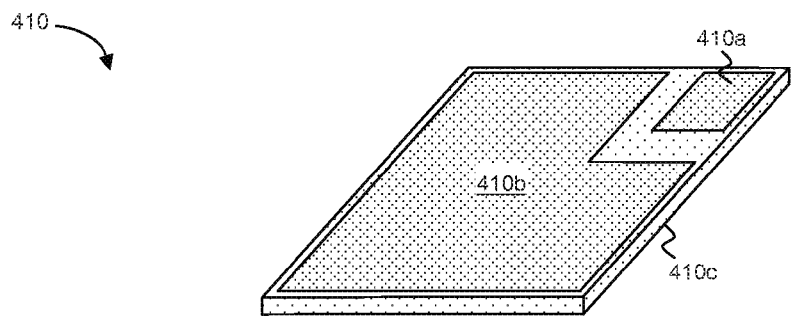
FIG. 6 is a perspective view of the first semiconductor chip.

Refer to FIG. 5, a first semiconductor chip 410 is flipped and connected on metal pillars 401'c and the second transverse extending part 403'a via conductive materials (not shown). The structure of the first chip 410 is shown in FIG. 6. The first chip 410 is usually a low side MOSFET, and its first electrode 410a, second electrode 410b are at the front of the first chip 410, while the third electrode 410c of the first chip 410 is at the back of the first chip 410. After the first chip 410 is flipped, the first electrode 410a of the first chip 410 is electrically contacted to the second transverse extending part 403'a and the second electrode 410b is electrical contacted to metal pillars 401'c. Since the top surface of the second transverse extending part 403'a is at the same level with the top surface of metal pillar 401'c, the flip chip 410 is kept horizontally thus the first electrode 410a and the second electrode 410b are kept seamlessly in contact with the second transverse extending part 403'a and metal pillar 401'c respectively. During the connecting process of the first chip 410, in order to avoid short circuit caused by the first chip 410 with some parts of the die paddle 401 around the recess area 401'a, the length and width of the first chip 410 are required to be shorter than the length L and width W of the recess area 401'a correspondingly. As shown in FIG. 4C, length L is just the length of longitudinal body 401'a-1, and the width W equals the width $W_2$ of transverse body 401'a-2 plus the width $W_1$ of longitudinal body 401'a-1. However, the size of the recess area 401'a can be adjusted accordingly to the size of the first chip 410 during the preparation of the recess area 401'a. For example, the size of the area surrounded with dotted line A1 in FIG. 4B is adjusted to be larger than the size of the first chip 410. In one embodiment, the first chip 410 is a vertical power MOSFET device with source electrode at the top and drain electrode at the bottom, in which, its first electrode 410a is usually the gate electrode, the second electrode 410b is usually source electrode, while the third electrode 410c is usually drain electrode with the first electrode 410a and the second electrode 410b insulated via a passivation layer. Alternatively, the first chip 410 may be a vertical power device with drain electrode at the top and the source electrode at the bottom, then the first electrode 410a is gate electrode, the second electrode 410b is drain electrode, and the third electrode 410c is source electrode.

Figure 7:
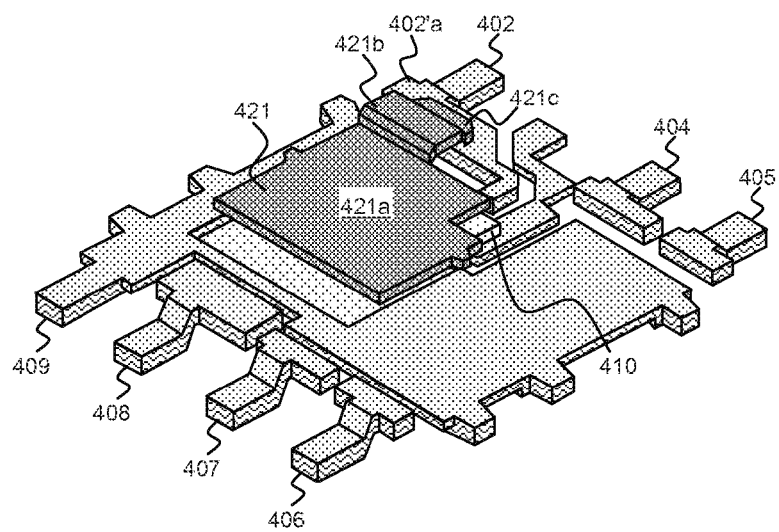
FIG. 7 is a perspective view illustrating a first metal connecting piece connecting first semiconductor chip to a first pins of the lead frame.
Figure 8:
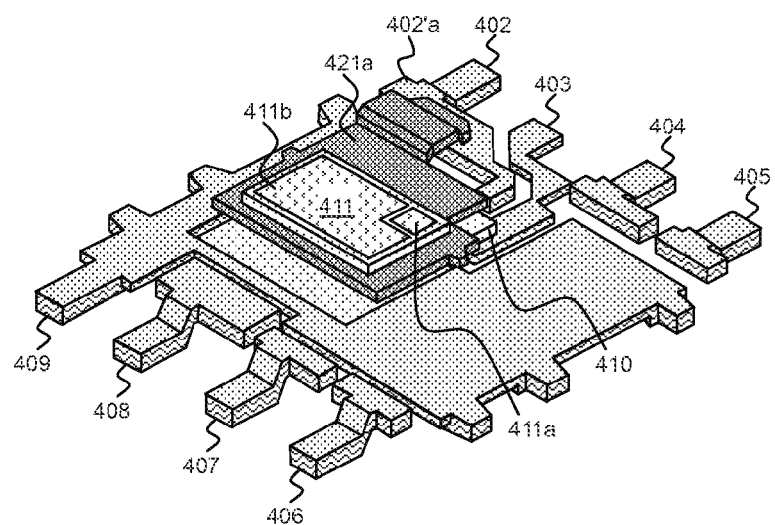
FIG. 8 is a perspective view illustrating a second semiconductor chip attached on top of the first metal piece of the first metal connecting piece.
Figure 9:
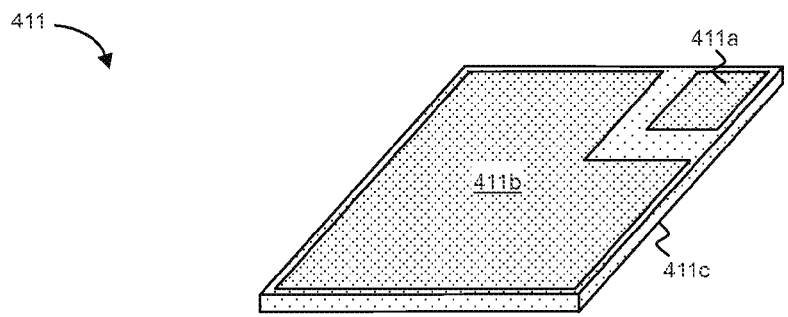
FIG. 9 is a perspective view illustrating the second semiconductor chip.

Refer to FIG. 7, the third electrode 410c at the back of the first chip 410 is connected to the first pin 402 through the first metal connecting piece 421. The first metal connecting piece 421 includes the first metal piece 421a, the first connecting structure 421b and the first soldering piece 421c. The first connecting structure 421b connects the first metal piece 421a and the first soldering piece 421c together. The first metal piece 421a is attached to the third electrode 410c of the first chip 410 via conductive materials, such as conductive silver paste or solder paste, or via eutectic soldering, with the bottom surface of the first metal piece 421a electrically contacted to the third electrode 410c of the first chip 410. The first soldering piece 421c is attached on top of the first transverse extending part 402'a via conductive materials. Then, as shown in FIG. 8, a second semiconductor chip 411 is attached on top of the first metal piece 421a. The structure of the second chip 411 is shown in FIG. 9, and the second chip 411 is usually a high side MOSFET of a semiconductor package. The first electrode 411a and the second electrode 411b of the second chip 411 are at the front side of the second chip 411, and the third electrode 411c of the second chip 411 is at the back side of the second chip 411. As the second chip 411 is attached on top of the first metal piece 421a, the third electrode 411c of the second chip 411 is attached to the top surface of the first metal piece 421a. In one embodiment, the second chip 411 is a vertical power MOSFET device with source electrode at the top and drain at the bottom of the MOSFET device, in which, its first electrode 411a is usually gate electrode, the second electrode 411b is usually source electrode, and the third electrode is usually drain electrode with the first electrode 411a and the second electrode 411b are insulated through a passivation layer. Alternatively, the second chip 411 can also be a vertical power device with drain electrode at the top and the source electrode at the bottom of the device, thus the first electrode 411a is gate electrode, the second electrode 411b is drain electrode, and the third electrode 411c is source electrode. In a DC-DC converter, N-type high side (HS) and low side (LS) MOSFETs are usually packaged in one package with the drain electrode of low side MOSFET electrically connected to the source electrode of high side MOSFET. When DC-DC converter is under normal operation, the source of low side MOSFET is grounded at the bottom of the package. Therefore, when the third electrode 410c of the first chip 410 is drain electrode, the third electrode 411c of the second chip 411 is the source electrode.

Figure 10:
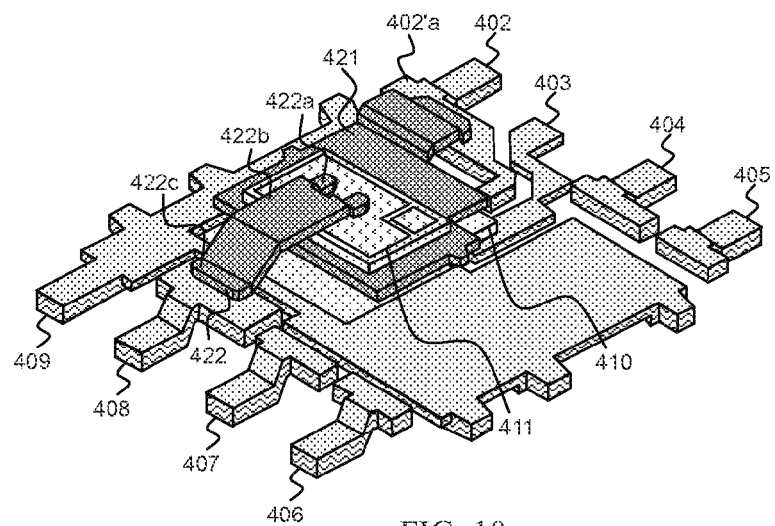
FIG. 10 is a perspective view illustrating the second metal connecting piece connecting the second electrode of the second semiconductor chip to the third pin of the lead frame.

Refer to FIG. 10, the second electrode 411b at the front side of the second chip 411 is connected to the third pin 408 through the second metal connecting piece 422. The second metal connecting piece 422 includes the second metal piece 422a, the second connecting structure 422b and the second soldering piece 422c with the second connecting piece 422b connecting the second metal piece 422a and the second soldering piece 422c together. The second metal piece 422a is attached on top of the second electrode 411b of the second chip 411 through conductive materials. The second soldering piece 422c is attached on top of the third pin soldering area 408' adjacent to transverse base 401'-2 through conductive materials.

Figure 11:
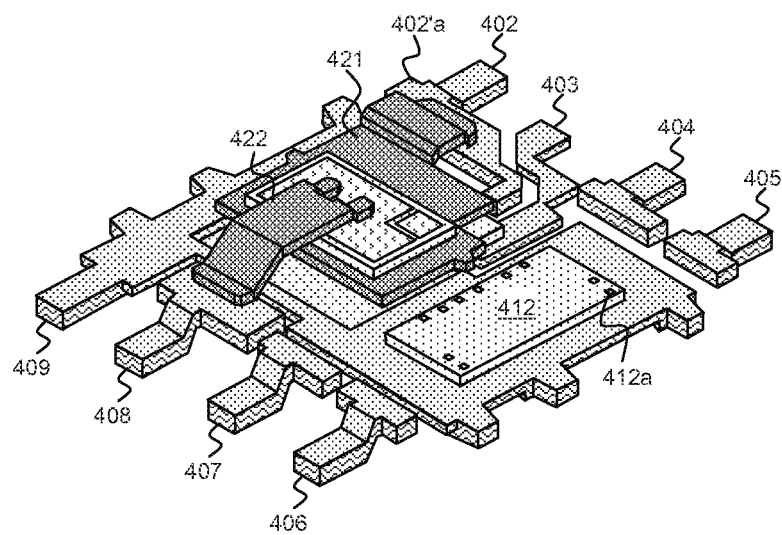
FIG. 11 is a perspective view illustrating a third semiconductor chip attached to the second chip installation area.
Figure 12A:
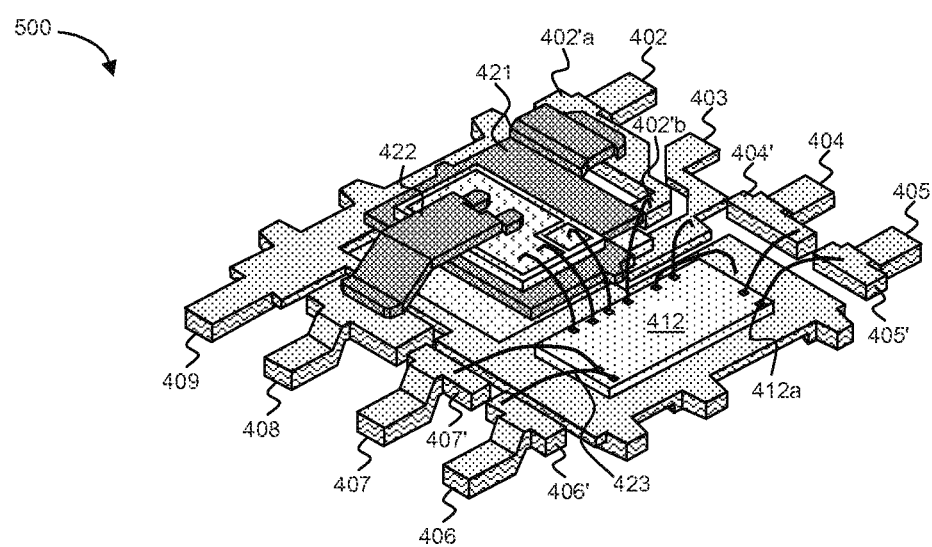
FIG. 12A is a perspective view of semiconductor device structure of FIG. 11 with I/O Pads formed on the third semiconductor chip and the bonding wires.

Refer to FIG. 11, a third semiconductor chip 412 is attached on top of the second chip installation area 401" through nonconductive adhesive (not shown), with the back side of the third chip 412 attached to the second chip installation area 401". To avoid the breakdown of the device 500 of FIG. 11, the third chip 412 can be a power control IC, which is used to control the gate signals from the first and the second chips 410, 411 to generate cut-off time for gate signals of high side and low side MOSFETs and prevent high side and low side MOSFETs from starting up simultaneously. Multiple I/O pads 412a are formed on the front side of the third chip 412, as shown in FIG. 12A, some of I/O pads formed at the front side of the third chip 412 are, through different bonding wires 423, respectively electrically connected to the first longitudinal extending part 402'b, the second longitudinal extending part 403'b, the second chip installation area 401", the first and second electrodes 411a, 411b of the second chip 411. The I/O pads connected to the first longitudinal extending part 402'b are simultaneously electrically connected to the third electrode 410c of the first chip 410 and the third electrode 411c of the second chip 411; the I/O pads connected to the second longitudinal extending part 403'b are electrically connected to the first electrode 410a of the first chip 410 to control the gate signals of the first chip 410; the I/O pads directly connected to the first electrode 411a of the second chip 411 are used to control gate signals of the second chip 411. Some of the I/O pads 412a are electrically connected, via bonding wires 423, to the fifth pin soldering area (such as the corresponding 404', 405', 406', 407') of the fifth pin (such as 404, 405, 406, 407). In integrated LS MOSFET and HS MOSFET devices, LS source is usually grounded, while generally, HS drain is directly or indirectly connected to anode of power supply; LS drain is connected to HS source; as such topology structure of the device can be rectifiers and adjusters.

In the above structures, the second longitudinal extending part 403'b is adjacent to the second chip installation area 401", and the first longitudinal extending part 402'b is adjacent to the second longitudinal extending part 403'b. This arrangement can effectively reduce the distance between the first longitudinal extending part 402'b, the second longitudinal extending part 403'b and the third chip 412, thus reduce the overall size of lead frame unit 400. In addition, the length of the of bonding wires connecting the first longitudinal extending part 402'b, the second longitudinal extending part 403'b and I/O pads of the third chip 412 is correspondingly reduced. It is well known in the art that RDS of power MOSFET device is an important factor that affects the performance of the device. The shorter the bonding wires are, the smaller resistance and discrete inductance are formed, which has significant influence on the switching speed of MOSFET.

In another embodiment, the third chip 412 can be replaced by any other suitable electronic components, such as a semiconductor chip of other type of device, a resistor and a capacitor and the likes. Thus the electrical connection between the I/O pads of these electronic components and the electrodes of the first chip 410 and the second chip 411 is adaptively adjusted. The second chip installation area 401" may include some unused area, beside the area for the installation of the third chip 412, which may be used to integrate more electronic components.

Figure 13A:
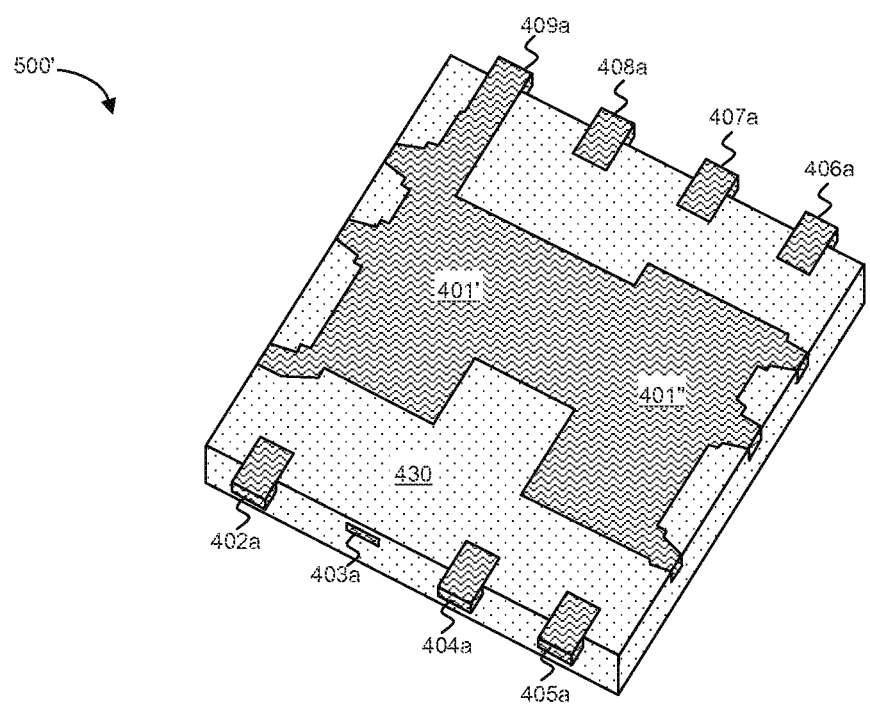
FIG. 13A is a perspective view illustrating the bottom of the plastic packaged semiconductor device shown in FIG. 12A.
Figure 14:
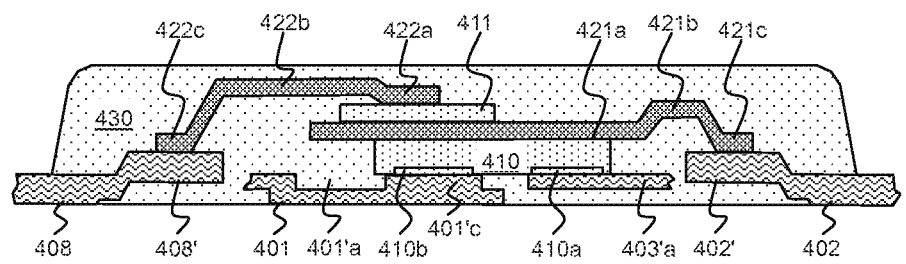
FIG. 14 is a cross sectional view of the plastic packaged semiconductor device shown in FIG. 12.

FIG. 13A is a perspective view illustrating the bottom surface of a package 500' encapsulating the semiconductor device 500 shown in FIG. 12A, and FIG. 14 is a cross sectional diagram of the package 500'. As shown in these figures, the semiconductor device is encapsulated for a physical protection by a mold compound 430. In FIG. 13A, the fourth external pin 409a, the third external pin 408a, the first external pin 402a and the fifth external pins 407a, 406a, 405a and 404a all extends out of mold compound 430, while the second external pin 403a does not extend out of mold compound 430. In semiconductor device 500, since notch 401'b extends into the recess area 401'a, the L shape of the recess area 401'a is arranged along the edge of the interface between notch 401'b and longitudinal base 401'-1 and the edge of the interface between notch 401'b and transverse base 401'-2 without any barrier between the recess area 401'a and notch 401'b. As shown in FIG. 4A, the remaining of the first chip installation area 401' surrounding the recess area 401'a forms sidewalls of the recess area 401'a except for the edge of the interface with notch 401'b and there is a big notch between the bottom of groove 401'a and the first chip 410, thus the mold compound can be completely filled in the recess area 401'a under the flip chip 410, which greatly improve the reliability of package 500'.

Figure 12B:
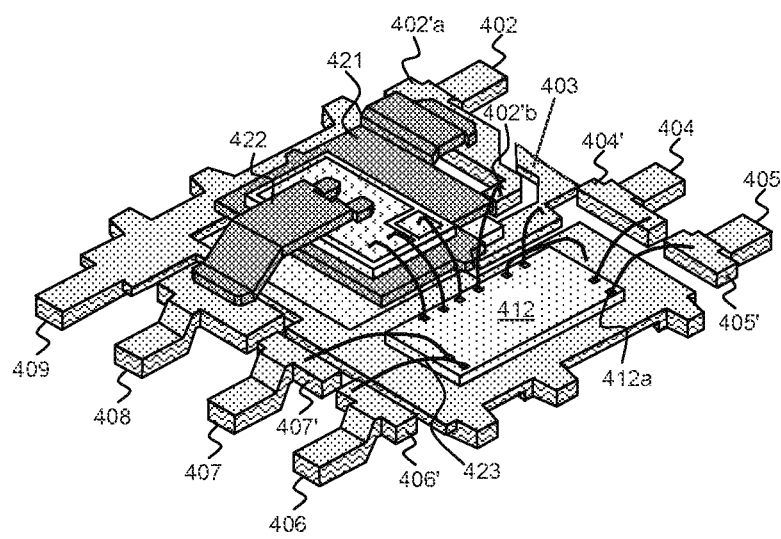
FIG. 12B is a perspective view of semiconductor device structure of FIG. 11 with I/O Pads formed on the third semiconductor chip and the bonding wires according to an alternative embodiment.
Figure 13B:
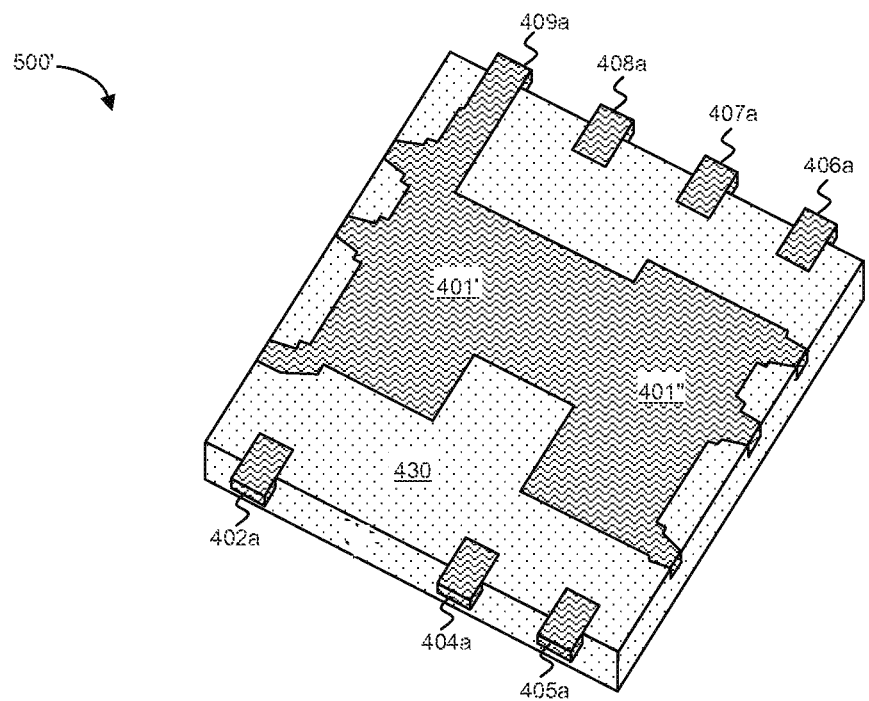
FIG. 13B is a perspective view illustrating the bottom of the plastic packaged semiconductor device shown in FIG. 12B.

FIG. 12B is a perspective view of an alternative embodiment of FIG. 12A. As shown in FIG. 12B, the second external pin 403a of the second pin 403 may be singulated after the wire bonding process completed so that the internal connection of the second pin 403 is encapsulated inside the mold compound 430 after molding process. The singulation of the second external pin 403a can be done by laser or mechanical means. FIG. 13B is a perspective view illustrating the bottom surface of a package 500' encapsulating the semiconductor device 500 shown in FIG. 12B. As shown in this figure, the semiconductor device is encapsulated for a physical protection by a mold compound 430. In FIG. 13B, the fourth external pin 409a, the third external pin 408a, the first external pin 402a and the fifth external pins 407a, 406a, 405a and 404a all extends out of mold compound 430, while the internal connection of the second pin 403 (not shown) is completely covered by the mold compound 430.

Figure 15:
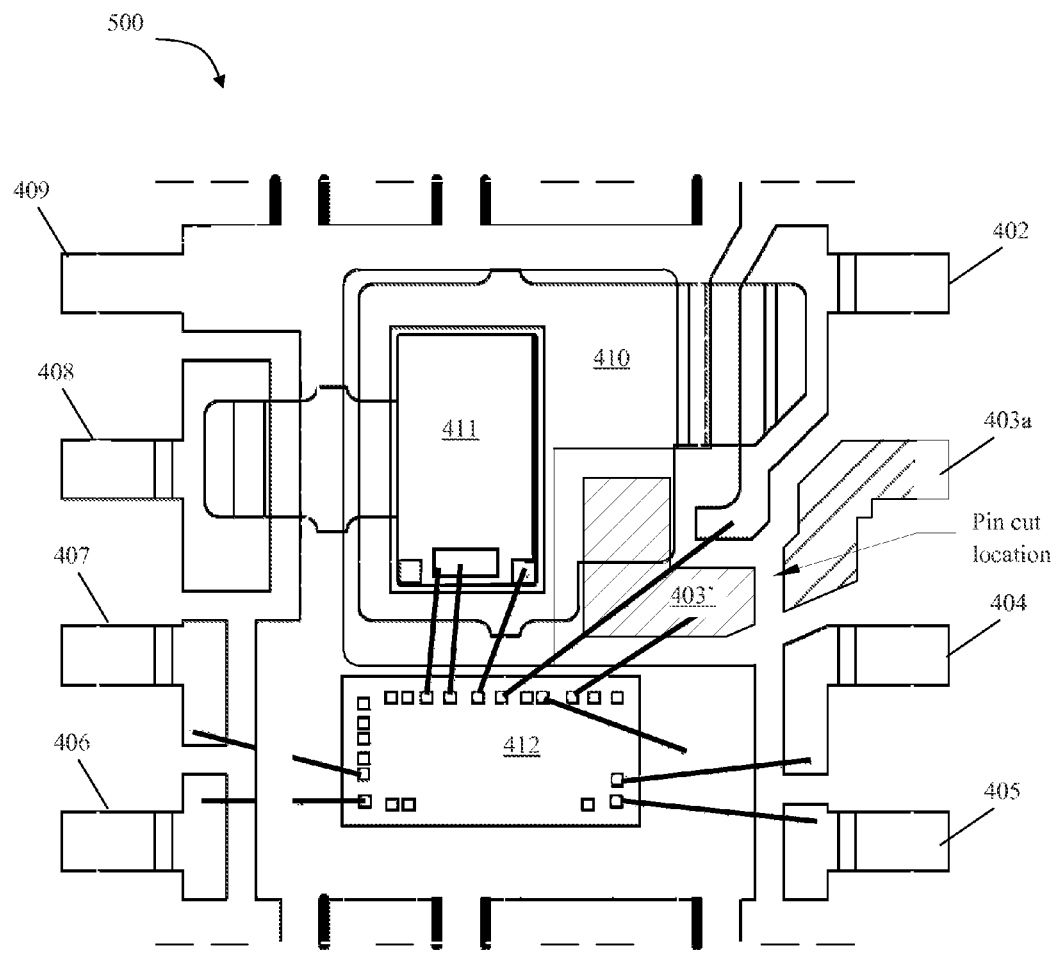
FIG. 15 is a top view of illustrating a semiconductor device of FIG. 11 with I/O Pads formed on the third semiconductor chip and the bonding wires according to another alternative embodiment.

FIG. 15 is a top view of an alternative embodiment of FIG. 12A. In this embodiment, the fourth pin 409, the third pin 408, the fifth pins 406, 407 are at one side of the die paddle 401, and the first pin 402, the second pin 403, the fifth pins 404, 405 are at the other side of the die paddle 401. The fourth pin 409, the third external pin 408a, the fifth external pins 407a and 406a are roughly at the same level and along the same line with each other, also the first external pin 402a, the second external pin 403a the fifth external pins 404a and 405a are roughly at the same level and along the same line with each other. In addition, in this embodiment, the second external pin 403a of the second pin 403 may be separated from the second pin soldering area 403' after the wire bonding process completed by cutting the second pin 403 at the pin cut location, which can be done by laser or mechanical means.

One advantage of this invention is that the first chip installation area 401' and the second chip installation area are formed on a die paddle 401 that is attached on PCBs via SMT technology, thus thermal dissipation performance is optimized.

There are different ways to install the semiconductor chips on the lead frame unit 400. For example, the first connecting piece 421b and the first soldering piece 421c can be replaced by other conductive materials such as bonding wires or conductive straps for electrically connecting the first metal piece 421a to the first transverse extending part 402'a. Furthermore, the second metal connecting piece 422 can be replaced by bonding wires or conductive straps for connecting the second electrode 411b of the second chip 411 to the third pin soldering area 408'.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

The invention claimed is:

1. A semiconductor device package comprising:
a die paddle comprising a first chip installation area and a second chip installation area, a notch, a recess area formed in the first chip installation area, and multiple metal pillars formed in the recess area, wherein the notch divides the first chip installation area into a transverse base portion extending transversely and a longitudinal base portion extending longitudinally, and separates the recess area into a transverse recess part formed in the transverse base and a longitudinal recess part formed in longitudinal base;
a first pin, a second pin and a third pin arranged near the first chip installation area, wherein the first pin includes a first external pin and a first pin soldering area connected to the first external pin, and the first pin soldering area includes a first transverse extending part and a first longitudinal extending part connected to the first transverse extending part; the second pin includes a second external pin and a second pin soldering area connected to the second external pin, and the second pin soldering area includes a second transverse extending part and a second longitudinal extending part connected to the second transverse extending part; the third pin includes a third external pin and a third pin soldering area connected to the third external pin, and wherein the second transverse extending part extends into a portion inside of the notch, the second longitudinal extending part is arranged along an edge of an interface between the notch and the second chip installation area, the first transverse extending part is arranged near the longitudinal base, and the first longitudinal extending part is adjacent to the second longitudinal extending part; and
a first semiconductor chip flipped and attached on the metal pillars and the second transverse extending part; a first and a second electrodes disposed at a front side of the first semiconductor chip are attached on the second transverse extending part and the metal pillars respectively and a third electrode at a back side of the first semiconductor chip is connected by a first metal connecting piece to the first pin, the first metal connecting piece includes a first metal piece, a first connecting structure and a first soldering piece, wherein the first metal piece is attached to the third electrode of the first chip and the first soldering piece is attached on the first transverse extending part;
a second semiconductor chip attached on the first metal piece, wherein a third electrode of the second semiconductor chip at a back side of the second semiconductor chip is attached on the first metal piece, a second electrode at a front side of the second semiconductor chip is connected through a second metal connecting piece to the third pin, the second metal connecting piece includes a second metal piece, a second connecting structure and a second soldering piece, the second metal piece is connected to the second electrode of the second semiconductor chip, the second soldering piece is connected to the third pin soldering area adjacent to the transverse base; and a third semiconductor chip attached on the second chip installation area, wherein I/O pads arranged at a front side of the third semiconductor chip are, through bonding wires, respectively electrically connected to the first and the second longitudinal extending part, the second chip installation area, the second electrode and the first electrode of the second semiconductor chip at the back of the second semiconductor chip.

2. The semiconductor device package of claim 1, wherein the first chip installation area composing the transverse base and the longitudinal base forms an L shape and the recess area is an L shape.

3. The semiconductor device package of claim 1, wherein the first pin soldering area is higher than the first external pin, and the third pin soldering area is higher than the third external pin.

4. The semiconductor device package of claim 1, wherein the top surface of the second transverse extending part is coplanar with a top surface of the metal pillars.

5. The semiconductor device package of claim 1, wherein the third semiconductor chip is attached to the second chip installation area with a nonconductive adhesive.

6. The semiconductor device package of claim 1 further comprising a fourth pin connected to the transverse base.

7. The semiconductor device package of claim 1 further comprising multiple fifth pins arranged near the second chip installation area, each of the fifth pins includes a fifth pin soldering area connected to a fifth external pin, wherein the I/O pads arranged at the front side of the third semiconductor chip are, through bonding wires, respectively electrically connected to the fifth pin soldering areas of multiple fifth pins.

8. The semiconductor device package of claim 7, wherein each of the fifth pin soldering area is higher than the fifth external pin.

9. The semiconductor device package of claim 8, wherein the first, third, fourth and fifth external pins extend out of a mold compound of the semiconductor device package, while the second external pin does not extend out of the mold compound.

10. The semiconductor device package of claim 8, wherein the second external pin is singulated after wire bonding process so that the first, third, fourth and fifth external pins extend out of a mold compound of the semiconductor device package, while internal connection of the second pin is encapsulated inside the mold compound of the semiconductor device package.

11. The semiconductor device package of claim 8, wherein the second external pin is separated from the second pin soldering area after wire bonding process by laser cut or mechanical cut, and wherein the first, second, third, fourth and fifth pins expose at two opposite sides of the die paddle with the first, second, third, fourth and fifth external pins are at the same level and along the same line with each other extend out of a mold compound of the semiconductor device package.

12. The semiconductor device package of claim 1, wherein the first transverse extending part extends transversely until the first longitudinal extending part is closed to the second longitudinal extending part and the first longitudinal extending part is kept parallel with the second longitudinal extending part.

13. The semiconductor device package of claim 1, wherein a length and a width of the first semiconductor chip are shorter than those of the recess area.

14. The semiconductor device package of claim 1, wherein the first longitudinal extending part is perpendicular to the first transverse extending part, and the second longitudinal extending part is perpendicular to the second transverse extending part.

15. The semiconductor device package of claim 1, wherein the first semiconductor chip is a low side (LS) MOSFET, the second semiconductor chip is a high side (HS) MOSFET, and the third semiconductor chip is a power control IC.

16. The semiconductor device package of claim 15, wherein the first electrode and the second electrode of the first semiconductor chip are respectively gate and source electrodes, the third electrode of the first semiconductor chip is a drain electrode, and the first electrode and the second electrode of the second semiconductor chip are respectively gate and drain electrodes, the third electrode of the second semiconductor chip is source electrode.

17. A lead frame unit for the preparation of a semiconductor device package comprising:

a first chip installation area, a second chip installation area and a notch formed in the base, and a recess area is also formed in the first chip installation area with multiple metal pillars formed in the recess area, wherein the notch divides the first chip installation area into a transverse base extending transversely and a longitudinal base extending longitudinally, and separate the recess area into a transverse recess part formed in the transverse base and a longitudinal recess part formed in the longitudinal base; and a first pin, a second pin and a third pin arranged near the first chip installation area; the first pin includes a first external pin and a first pin soldering area connected to the first external pin, and the first pin soldering area includes a first transverse extending part and a first longitudinal extending part connected to the first transverse extending part; the second pin includes a second external pin and a second pin soldering area connected to the second external pin, and the second pin soldering area includes a second transverse extending part and a second longitudinal extending part connected to the second transverse extending part; the third pin includes a third external pin and a third pin soldering area connected to the third external pin; wherein the second transverse extending part extends into a portion inside of the notch, the second longitudinal extending part is arranged along an edge of an interface between the notch and the second chip installation area, the first transverse extending part is arranged near the longitudinal base, and the first longitudinal extending part is adjacent to the second longitudinal extending part.

18. The lead frame unit of claim 17, wherein the first chip installation area composing the transverse base and the longitudinal base forms an L shape and the recess area is an L shape.

19. The lead frame unit of claim 17, wherein the first pin soldering area is higher than the first external pin, and the third pin soldering area is higher than the third external pin.

20. The lead frame unit of claim 17, wherein a top surface of the second transverse extending part is coplanar with a top surface of the metal pillars.

21. The lead frame unit of claim 17 further comprising a fourth pin connected to the transverse base.

22. The lead frame unit of claim 17 further comprising multiple fifth pins arranged near the second chip installation area, each of the fifth pins includes a fifth external pin and a fifth pin soldering area connected to the fifth external pin, and the fifth pin soldering area is higher than the fifth external pin connected to the fifth pin soldering area.

23. The lead frame unit of claim 17, wherein the first transverse extending part extends transversely until the first longitudinal extending part is closed to the second longitudinal extending part and the first longitudinal extending part is kept parallel with the second longitudinal extending part.

24. The lead frame unit of claim 17, wherein the first longitudinal extending part is perpendicular to the first transverse extending part, and the second longitudinal extending part is perpendicular to the second transverse extending part.

25. A semiconductor device package comprising:
a die paddle comprising a first chip installation area and a second chip installation area, a notch, a recess area formed in the first chip installation area, and multiple metal pillars formed in the recess area, wherein the notch divides the first chip installation area into a transverse base portion extending transversely and a longitudinal base portion extending longitudinally, and separates the recess area into a transverse recess part formed in the transverse base and a longitudinal recess part formed in longitudinal base;
a first pin, a second pin and a third pin arranged near the first chip installation area, wherein the first pin includes a first external pin and a first pin soldering area connected to the first external pin, and the first pin soldering area includes a first transverse extending part and a first longitudinal extending part connected to the first transverse extending part; the second pin includes a second external pin and a second pin soldering area connected to the second external pin, and the second pin soldering area includes a second transverse extending part and a second longitudinal extending part connected to the second transverse extending part; the third pin includes a third external pin and a third pin soldering area connected to the third external pin, and wherein the second transverse extending part extends into a portion inside of the notch, the second longitudinal extending part is arranged along an edge of an interface between the notch and the second chip installation area, the first transverse extending part is arranged near the longitudinal base, and the first longitudinal extending part is adjacent to the second longitudinal extending part; and
a first semiconductor chip flipped and attached on the metal pillars and the second transverse extending part; a first and a second electrodes disposed at a front side of the first semiconductor chip are attached on the second transverse extending part and the metal pillars respectively and a third electrode at a back side of the first semiconductor chip is connected by a first metal connecting piece to the first pin, the first metal connecting piece includes a first metal piece, a first connecting structure and a first soldering piece, wherein the first metal piece is attached to the third electrode of the first chip and the first soldering piece is attached on the first transverse extending part;
a second semiconductor chip attached on the first metal piece, wherein a third electrode of the second semiconductor chip at a back side of the second semiconductor chip is attached on the first metal piece, a second electrode at a front side of the second semiconductor chip is connected through a second metal connecting piece to the third pin, the second metal connecting piece includes a second metal piece, a second connecting structure and a second soldering piece, the second metal piece is connected to the second electrode of the second semiconductor chip, the second soldering piece is connected to the third pin soldering area adjacent to the transverse base; and
a third semiconductor chip attached on the second chip installation area, wherein I/O pads arranged at a front side of the third semiconductor chip are, through bonding wires, respectively electrically connected to the first and the second longitudinal extending part, the second chip installation area, the second electrode and the first electrode of the second semiconductor chip at the back of the second semiconductor chip; and
multiple fifth pins arranged near the second chip installation area, each of the fifth pins includes a fifth pin soldering area connected to a fifth external pin, wherein the I/O pads arranged at the front side of the third semiconductor chip are, through bonding wires, respectively electrically connected to the fifth pin soldering areas of multiple fifth pins
wherein the second external pin is singulated after a wire bonding process so that the first, third, fourth and fifth external pins extend out of a mold compound of the semiconductor device package, while internal connection of the second pin is encapsulated inside the mold compound of the semiconductor device package.

26. The semiconductor device package of claim 25, wherein the second external pin is singulated using laser cut prior a molding process.

27. The semiconductor device package of claim 25, wherein the second external pin is singulated using mechanical cut after wire bonding process.

* * * * *